(12) United States Patent
Hsu

(10) Patent No.: US 6,905,897 B1
(45) Date of Patent: Jun. 14, 2005

(54) WAFER ACCEPTANCE TESTING METHOD AND STRUCTURE OF A TEST KEY USED IN THE METHOD

(75) Inventor: Ping Hsu, Chung-Ho (TW)

(73) Assignee: Nanya Technology Corp., Tao-Yuan Hsien (TW)

( * ) Notice: Subject to any disclaimer, the term of this patent is extended or adjusted under 35 U.S.C. 154(b) by 0 days.

(21) Appl. No.: 10/707,398

(22) Filed: Dec. 10, 2003

(51) Int. Cl.[7] .......................... H01L 21/66; H01L 23/58
(52) U.S. Cl. ........................................ 438/18; 257/48
(58) Field of Search ................................ 257/48; 438/5, 438/10, 11, 14, 17, 18; 365/201

(56) References Cited

U.S. PATENT DOCUMENTS

| | | | | |
|---|---|---|---|---|
| 6,339,228 B1 | * | 1/2002 | Iyer et al. | 257/48 |
| 6,693,834 B1 | * | 2/2004 | Wu et al. | 365/201 |
| 6,788,598 B2 | * | 9/2004 | Chang et al. | 365/201 |
| 6,801,462 B2 | * | 10/2004 | Chang et al. | 365/201 |
| 2004/0017710 A1 | * | 1/2004 | Chang et al. | 365/201 |
| 2004/0029301 A1 | * | 2/2004 | Wu et al. | 438/14 |
| 2004/0031960 A1 | * | 2/2004 | Wu et al. | 257/48 |
| 2004/0033634 A1 | * | 2/2004 | Wu et al. | 438/14 |
| 2004/0056248 A1 | * | 3/2004 | Liu et al. | 257/48 |
| 2004/0069989 A1 | * | 4/2004 | Wu et al. | 257/48 |
| 2004/0076056 A1 | * | 4/2004 | Chang et al. | 365/201 |
| 2004/0082087 A1 | * | 4/2004 | Wu et al. | 438/17 |
| 2004/0179409 A1 | * | 9/2004 | Wu et al. | 365/199 |

* cited by examiner

Primary Examiner—Evan Pert
(74) Attorney, Agent, or Firm—Winston Hsu

(57) ABSTRACT

A wafer acceptance testing method for monitoring GC-DT misalignment and a test key structure are disclosed. The test key includes a deep trench capacitor structure biased to a first voltage ($V_{DT}$). The deep trench capacitor structure includes a buried strap out diffusion region A GC-T electrode layout, which is biased to a second voltage ($V_{GC-T}$), includes a plurality of columns of GC-T fingers. A GC-B electrode layout, which is biased to a third voltage ($V_{GC-B}$), includes a plurality of columns of GC-B fingers that interdigitate the GC-T fingers. A first capacitance $C_1$ of a first capacitor contributed by the GC-T fingers and the buried strap out diffusion region is measured. A second capacitance $C_2$ of a second capacitor contributed by the GC-B fingers and the buried strap out diffusion region is measured. The first capacitance $C_1$ and second capacitance $C_2$ are compared, wherein when $C_1 \neq C_2$, GC-DT is misaligned.

9 Claims, 9 Drawing Sheets it is not accurate because there are so
many factors affecting the threshold voltages shift of the
GC-B 201 and GC-T 204. Some of these factors include
narrow GC line width, thermal budget of ion implantation,
and GC sidewall etching. Therefore, it is difficult for an
inspector to judge the GC-DT misalignment merely according to the measured threshold voltage shift data.
Consequently, there is a need to provide an improved wafer
acceptance testing method for accurately monitoring GC-DT
misalignment.

WAFER ACCEPTANCE TESTING METHOD AND STRUCTURE OF A TEST KEY USED IN THE METHOD

BACKGROUND OF INVENTION

1. Field of the Invention

The present invention relates to a wafer acceptance testing (WAT) method, and more particularly, to a WAT method for monitoring gate conductor-deep trench (GC-DT) misalignment and a test key structure used in this method.

2. Description of the Prior Art

In semiconductor fabrication, a semiconductor device or an integrated circuit (IC) should be continuously tested in every step so as to maintain device quality. Usually, a testing circuit is simultaneously fabricated with an actual device so that quality of the actual device can be judged by a performance of the testing circuit. The quality of the actual device therefore can be well controlled. Typically, such testing circuit, which is also referred to as "test key", is disposed on peripheral area of each chip or die.

Please refer to FIG. 1 and FIG. 2. FIG. 1 is an enlarged top view of a part of a conventional test key layout for monitoring GC-DT (Gate Conductor-Deep Trench) misalignment during the fabrication of deep trench capacitors of a trench capacitor DRAM device. FIG. 2 is a schematic cross-sectional diagram showing the test key structure along line N—N of FIG. 1. As shown in FIG. 1, the test key layout 1 is fabricated on a silicon substrate 10, usually within a scribe line area. The test key layout 1 comprises two adjacent deep trench capacitors 11 and 12 electrically connecting to each other through out diffusions 30 therebetween. The deep trench capacitors 11 and 12 of the test key layout 1 are fabricated simultaneously with those deep trench capacitors arranged in the memory array using the same fabrication processes. Therefore, the structure of each of the deep trench capacitors 11 and 12 and the structure of each of the deep trench capacitors in the memory array are substantially the same. Basically, as best seen in FIG. 2, each of the deep trench capacitors 11 and 12, which are embedded into a main surface of the silicon substrate 10, comprises a buried plate 111, a capacitor dielectric 112, storage node 113, and oxide collar 114. The storage node 113 of the deep trench capacitor 11 and the storage node 113 of the deep trench capacitor 12 are electrically connected to each other through the overlapping out diffusions 30. A cap insulation layer 115 is disposed atop each of the deep trench capacitors 11 and 12. A plurality of gate conductor (GC) lines overlays the deep trench capacitors 11 and 12. As specifically indicated in FIG. 1, these GC lines are alternately denoted by "T" and "B", wherein "T" stands for a top GC line (GC-T) and "B" stands for a bottom GC line (GC-B). The plurality of GC lines including GC-T and GC-B are arranged in column on the main surface of the silicon substrate 10. The GC-B 201 is disposed at one side of the deep trench capacitor 11. The GC-T 202 runs over the deep trench capacitor 11. The GC-B 203 runs over the deep trench capacitor 12. The GC-T 204 is disposed at one side of the deep trench capacitor 12.

As best seen in FIG. 2, the GC-B 201 acts as a switching transistor of the deep trench capacitor 11. The GC-T 204 acts as a switching transistor of the deep trench capacitor 12. Heavily doped source/drain 301 is implanted into the silicon substrate 10 at both sides of each of the GC-B 201 and GC-T 204. According to the prior art method, to assess the GC-DT misalignment, the threshold voltage ($V_{TH}$) shifts of the GC-B 201 and GC-T 204 are measured as known to those skilled in the art. However, the prior art GC-DT misalignment evaluation method

SUMMARY OF INVENTION

It is the primary object of the present invention to provide a novel wafer acceptance testing (WAT) method for accurately monitoring GC-DT misalignment.

Another object of the present invention is to provide a novel WAT method and structure of a test key used in this WAT method.

According to the claimed invention, a wafer acceptance testing (WAT) method for monitoring gate conductor-deep trench (GC-DT) misalignment is provided. A test key structure comprising a deep trench capacitor structure biased to a first voltage ($V_{DT}$ embedded in a substrate is provided. At least one active area is defined on the substrate. The deep trench capacitor structure is electrically connected to an out diffusion in the active area and is isolated by shallow trench isolation (STI). The deep trench capacitor structure comprises interdigitated GC-T electrode layout and GC-B electrode layout. The GC-T electrode layout is biased to a second voltage ($V_{GC-T}$), and the GC-B electrode layout is biased to a third voltage ($V_{GC-B}$). The GC-T electrode layout comprises a plurality of first GC fingers, and the GC-B electrode layout comprises a plurality of second GC fingers. The capacitance of a first capacitor C1 is measured. The GC-T electrode layout serves as a first electrode of the first capacitor C1. The out diffusion serves as a second electrode of the first capacitor C1. The capacitance of a second capacitor C2 is also measured. The GC-B electrode layout serves as a first electrode of the second capacitor C2. The out diffusion serves as a second electrode of the second capacitor C2. The capacitance of the first capacitor C1 with the capacitance of the second capacitor C2 are compared, wherein if $C_1 \neq C_2$, GC-DT misalignment occurs.

Other objects, advantages and novel features of the invention will become more clearly and readily apparent from the following detailed description when taken in conjunction with the accompanying drawings.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings:

FIG. 3 to FIG. 9 are schematic diagrams illustrating the fabrication processes of making a test key structure for monitoring GC-DT misalignment in accordance with one preferred embodiment of the present invention, wherein FIG. 4 is a cross-sectional view along line A—A of FIG. 3;

FIG. 6 is a cross-sectional view along line B—B of FIG. 5; and

FIG. 8 is a cross-sectional view along line C—C of FIG. 7.

DETAILED DESCRIPTION

Figure 1:
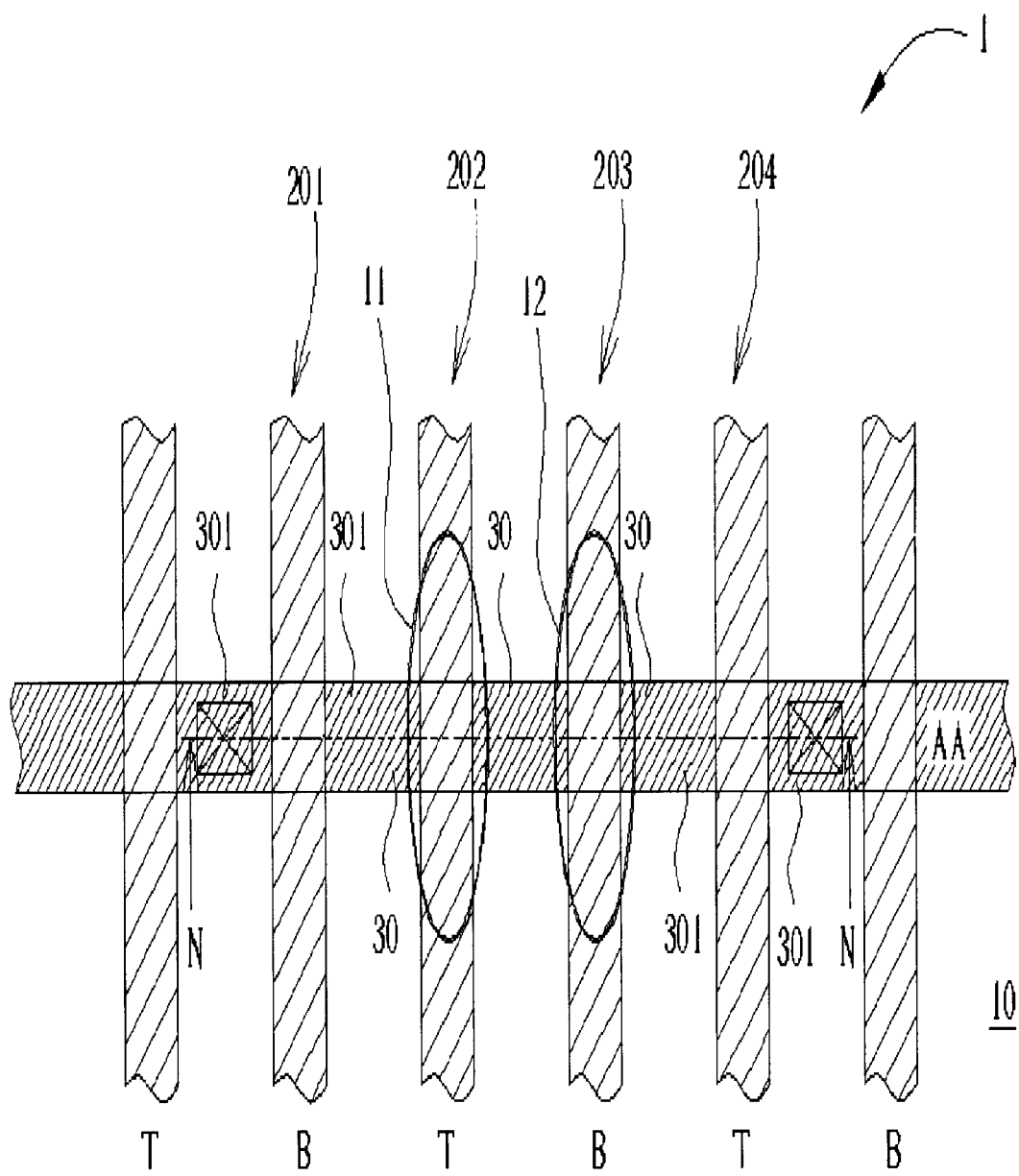
FIG. 1 is an enlarged top view of a part of a conventional test key layout for monitoring GC-DT misalignment during the fabrication of deep trench capacitors of a trench capacitor DRAM device.
Figure 2:
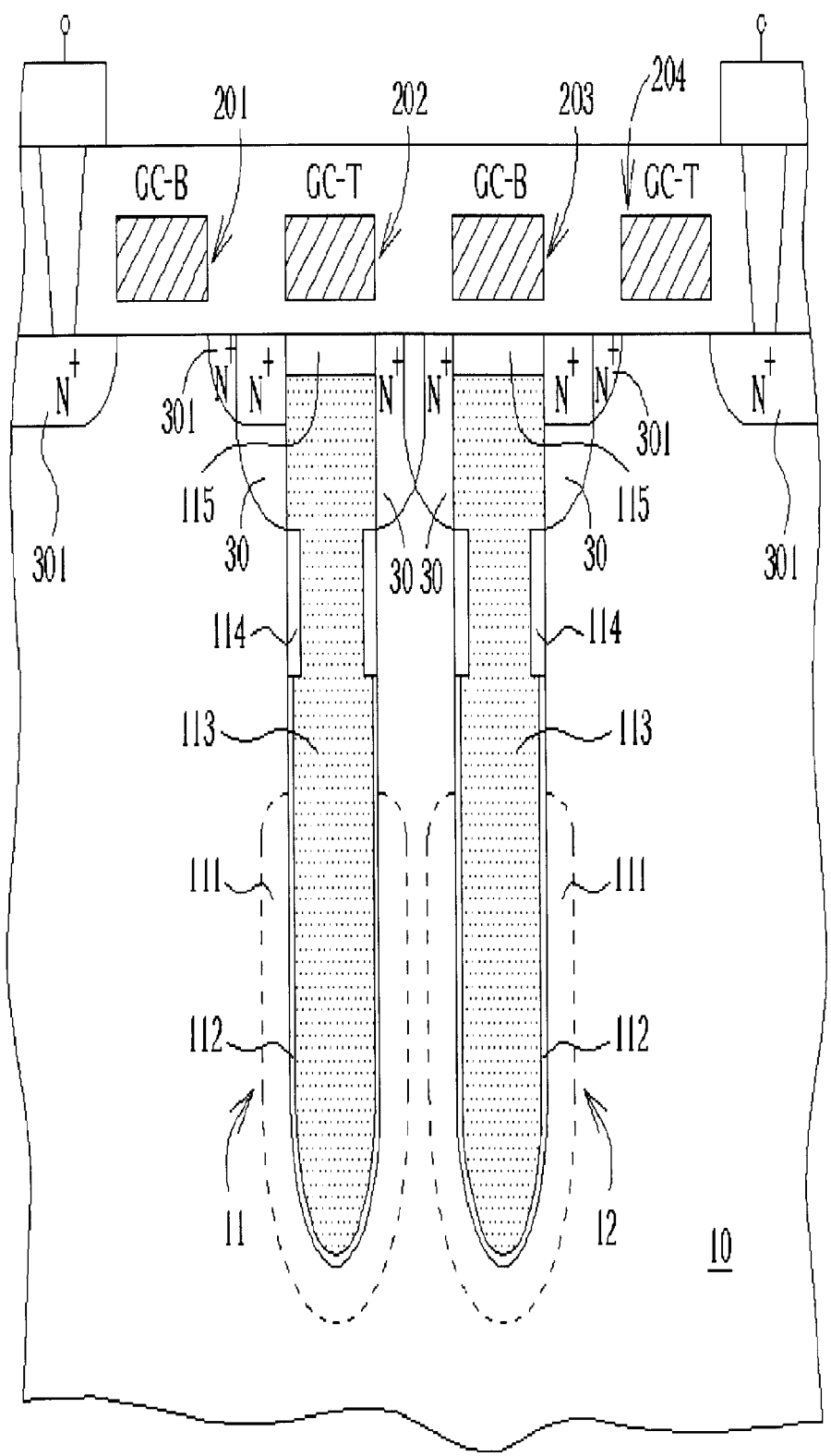
FIG. 2 is a schematic cross-sectional diagram showing the test key structure along line N—N of FIG. 1.
Figure 3:
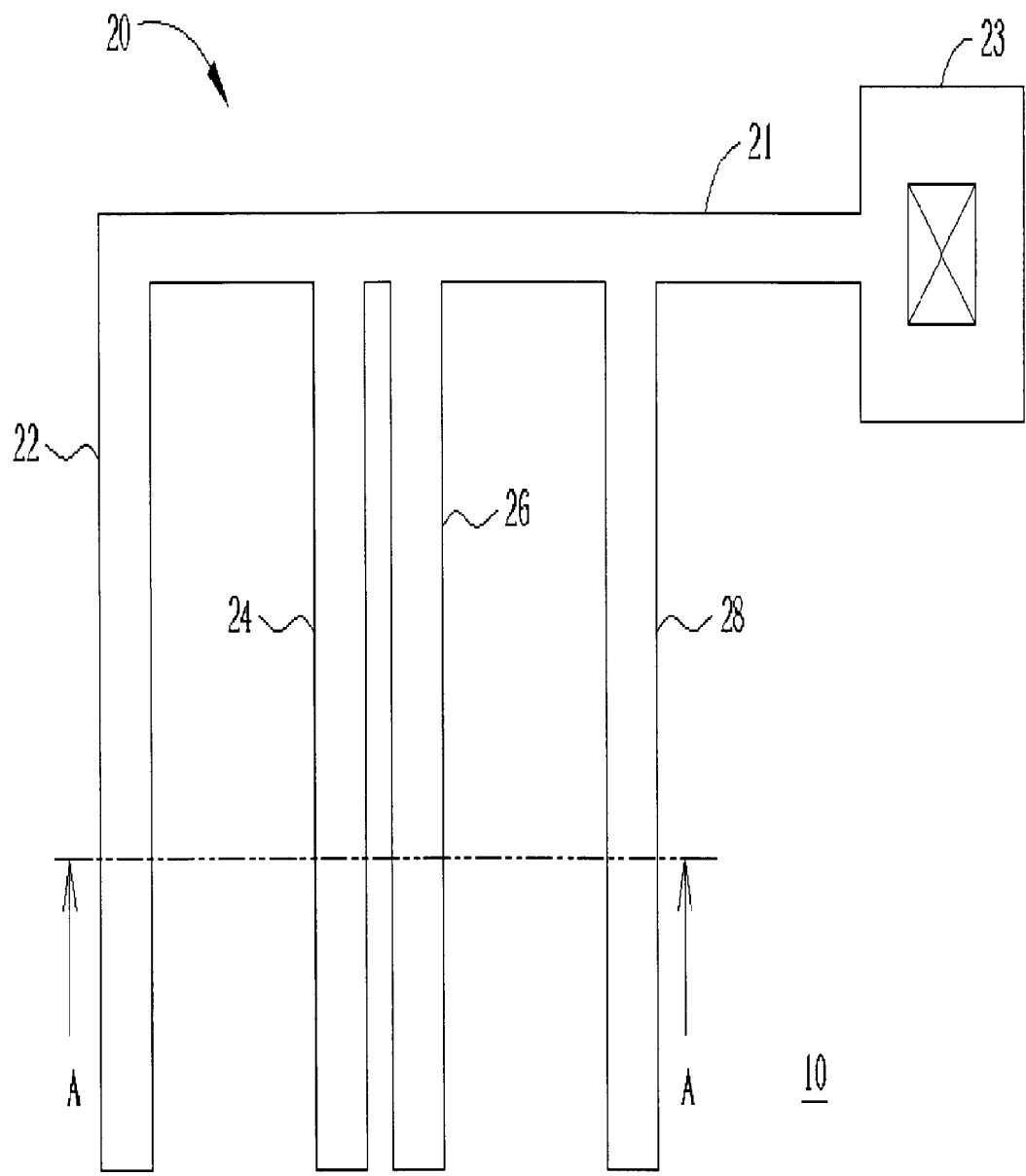
Figure 4:
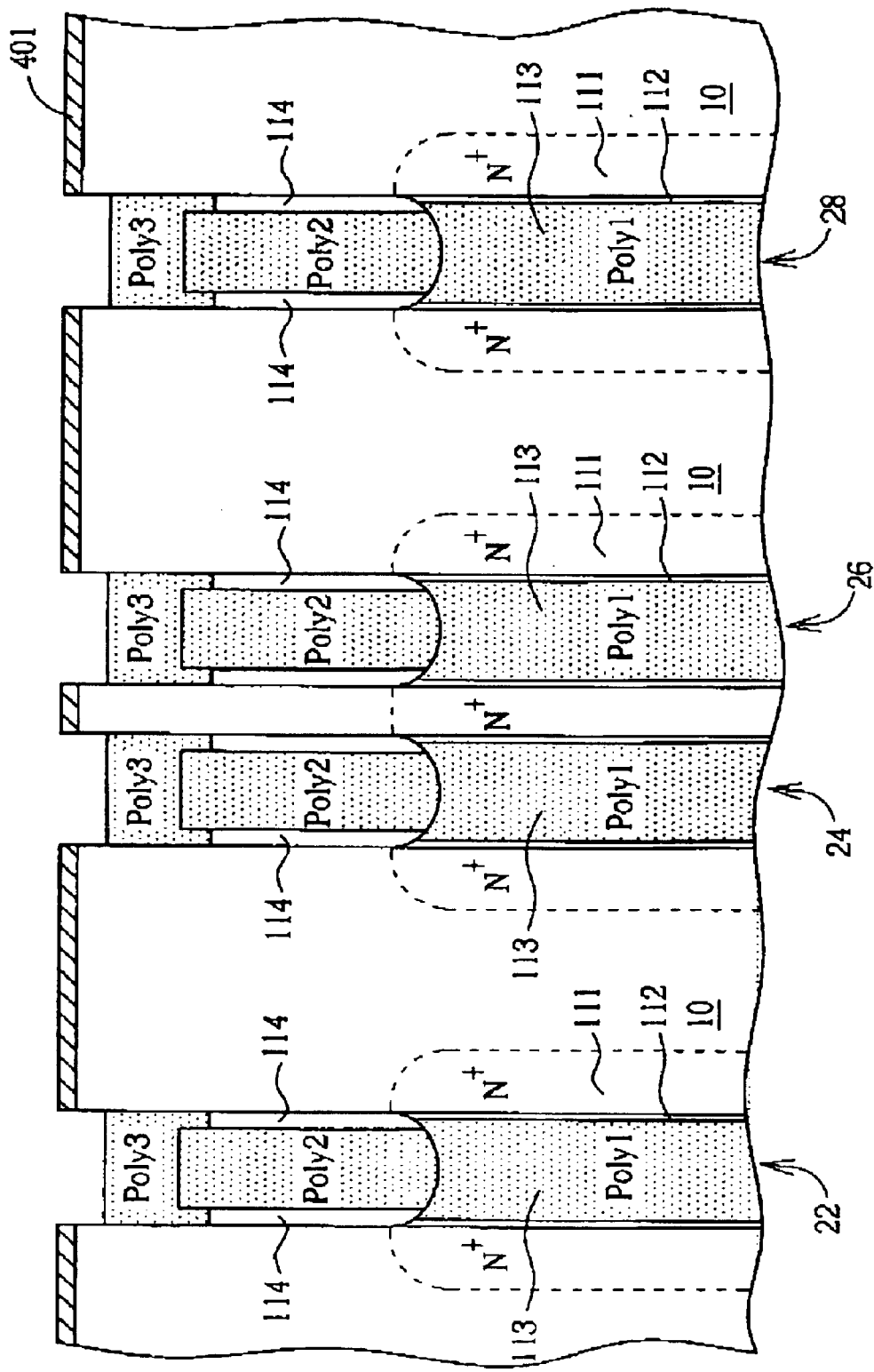
Figure 5:
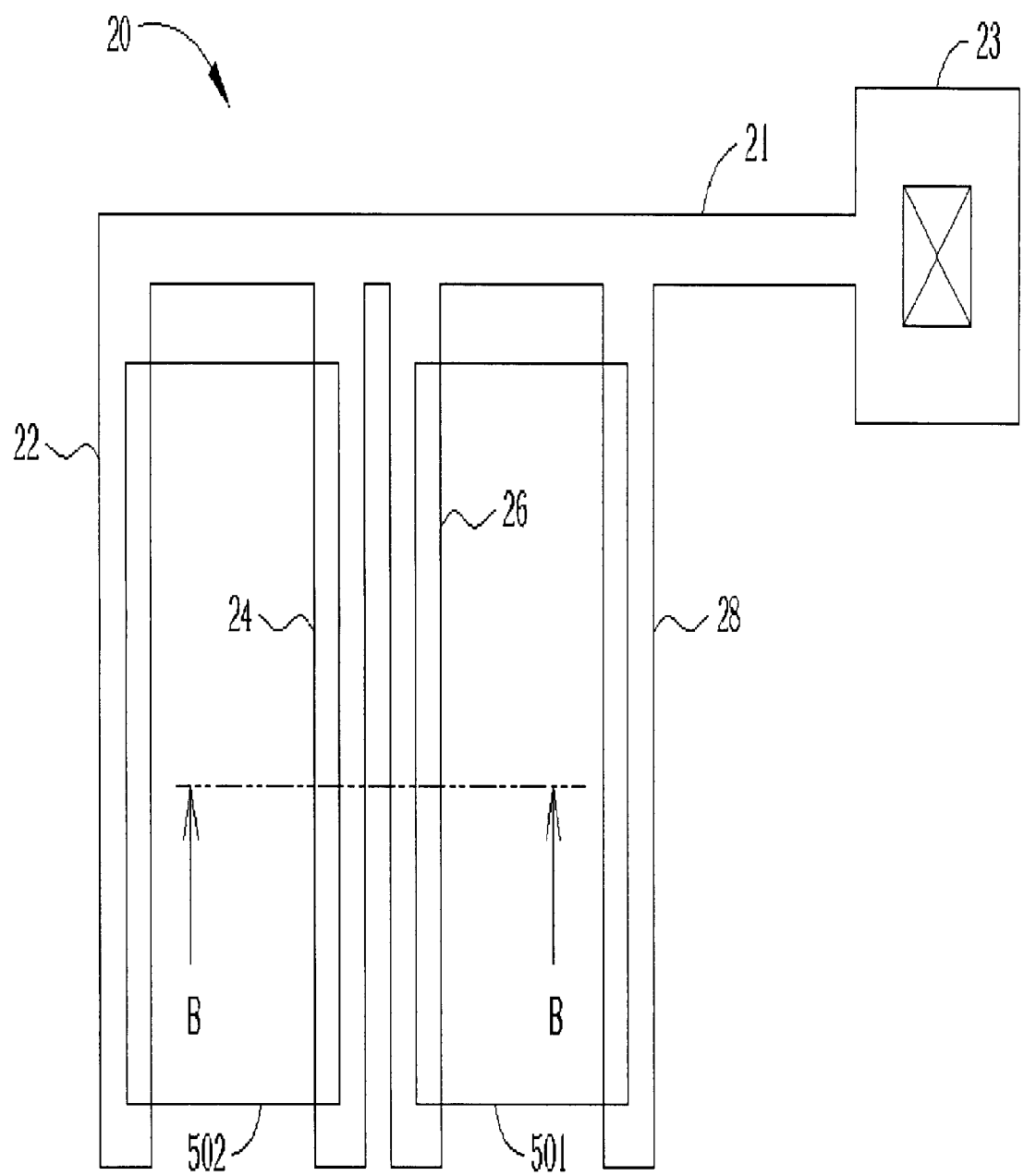
Figure 6:
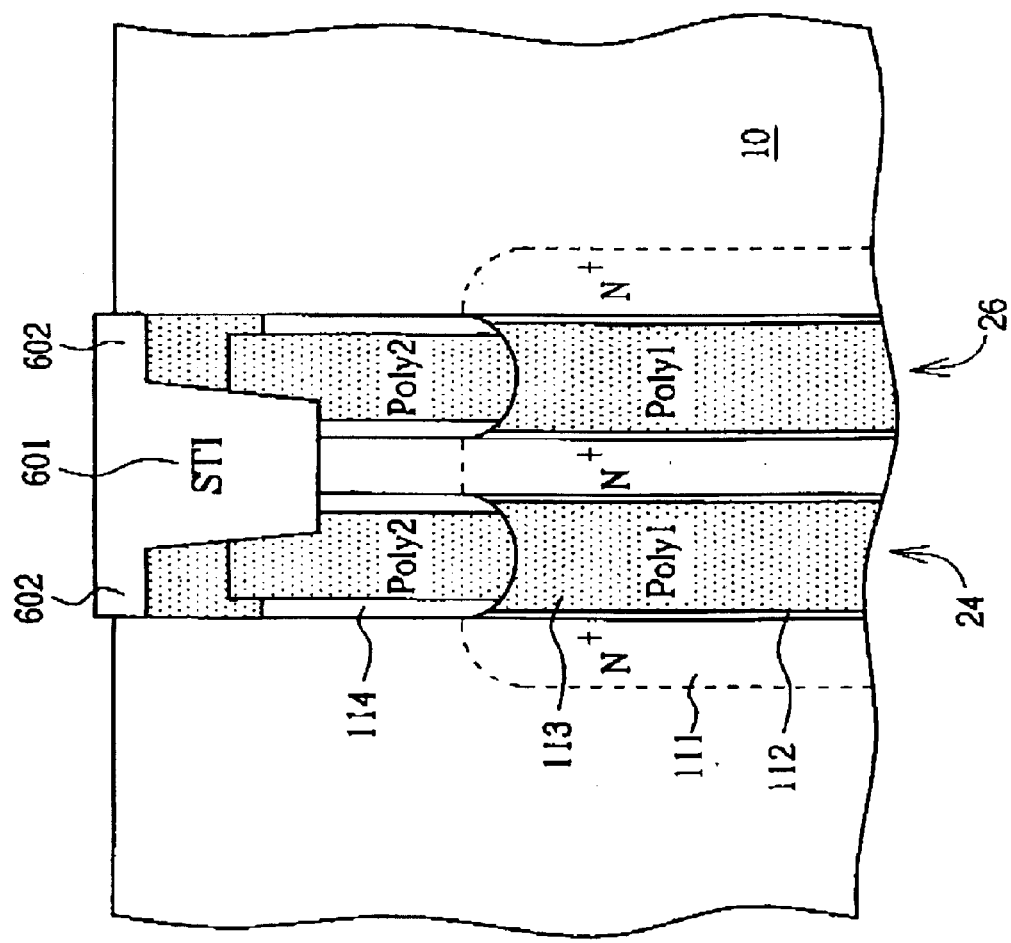
Figure 7:
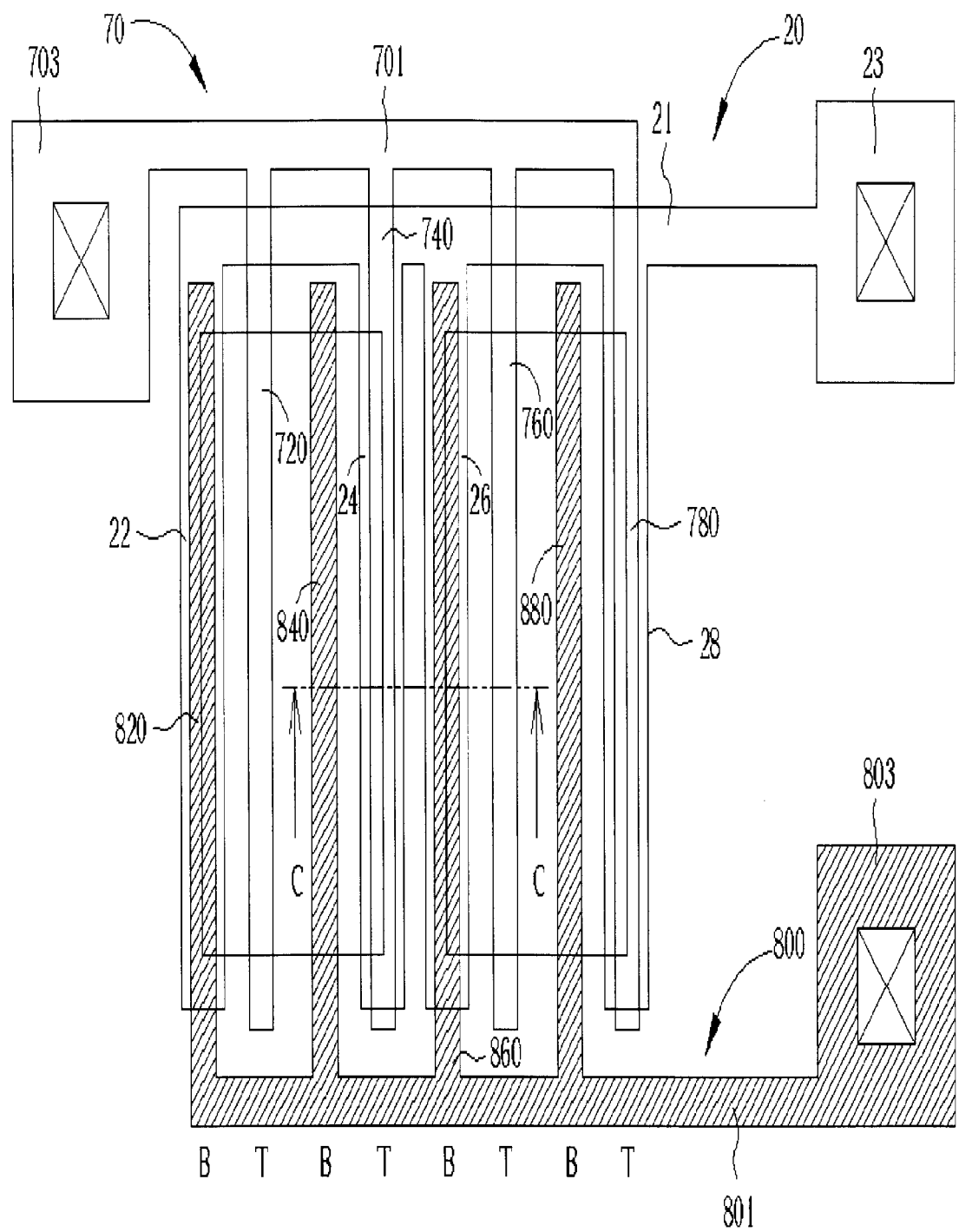
Figure 8:
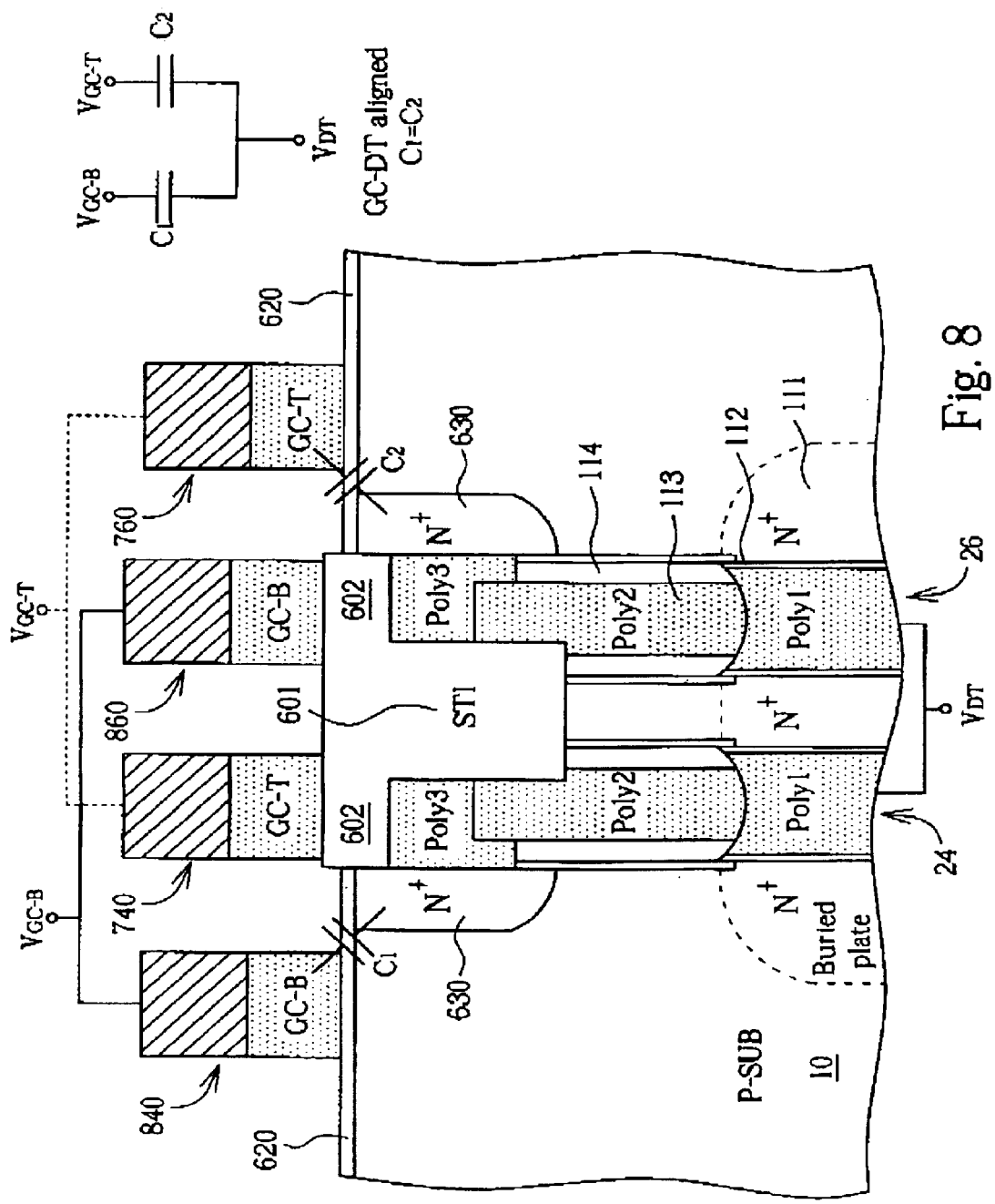

Please refer to FIG. 3 to FIG. 9. FIG. 3 to FIG. 9 are schematic diagrams illustrating the fabrication processes of making a test key structure for monitoring GC-DT misalignment in accordance with one preferred embodiment of the present invention, wherein FIG. 4 is a cross-sectional view along line A—A of FIG. 3; FIG. 6 is a cross-sectional view along line B—B of FIG. 5; and FIG. 8 is a cross-sectional view along line C—C of FIG. 7. Through FIG. 3 to FIG. 9, similar numerals designate similar devices, regions or elements set forth in FIG. 1 and FIG. 2. The novel wafer acceptance testing (WAT) method using the test key structure of the present invention will also be explained in detail with reference to FIG. 8 and FIG. 9.

As shown in FIG. 3, a finger-type deep trench layout 20 is fabricated simultaneously with the memory array capacitors (not shown) in a substrate 10 such as a P type silicon substrate. The deep trench layout 20, which is fabricated within a peripheral area or a scribe line area, comprises a connection portion 21, a contact portion 23, and a plurality of elongated finger deep trench portions 22, 24, 26, and 28 that are connected to the connection portion 21. The contact portion 23 may be disposed at one distal end of the connection portion 21 and is electrically connected thereto. A contact device such as contact plug (not explicitly shown) is used to connect the contact portion 23 with voltage signals for testing.

The cross sections of the plurality of elongated finger deep trench portions 22, 24, 26, and 28 are illustrated in FIG. 4. As shown in FIG. 4, the sectional structure of each of the elongated finger deep trench portions 22, 24, 26, and 28 and the sectional structure of the deep trench capacitor in the memory array (not shown) are the same, since they are fabricated using the same fabrication processes. According to the preferred embodiment of the present invention, each of the elongated finger deep trench portions 22, 24, 26, and 28 comprises a buried plate 111 adjacent to a lower portion of a deep trench thereof, a capacitor dielectric lining surface of the deep trench, a storage node 113, and oxide collar 114. At this phase, a pad layer 401 such as silicon nitride silicon oxy-nitride or silicon oxide is still on the surface of the substrate 10. The method for fabricating a trench capacitor of a DRAM device is known in the art and may include several major manufacture phases as follows:

Phase 1: deep trench etching.

Phase 2: buried plate and capacitor dielectric (or node dielectric) forming.

Phase 3: first polysilicon deep trench fill and first recess etching.

Phase 4: collar oxide forming.

Phase 5: second polysilicon deposition and second recess etching.

Phase 6: third polysilicon deposition and third recess etching.

Phase 7: shallow trench isolation (STI) forming.

According to the preferred embodiment, the storage node 113 consists of three layers of polysilicon: Poly-1, Poly-2 and Poly-3. Poly-1 is electrically insulated from the buried plate 111 by the capacitor dielectric 112. Poly-2 is electrically insulated from the substrate 10 by the oxide collar 114. Poly-3, which is also referred to as "buried strap poly", is in contact with the substrate 10. Typically, Poly-3 is non-doped polysilicon. In a later thermal stage, dopants in the heavily doped Poly-2 will diffuse to the substrate 10 in contact with the Poly-3.

Definition of active areas (AA) and STI is next carried out simultaneously with the memory array. First, as shown in FIG. 5, photoresist layer patterns 501 and 502 mask predetermined active areas on the substrate 10 by conventional lithography. A dry etching is then performed to etch the substrate 10 in the STI areas where the surface areas not masked by the active resist patterns 501 and 502. The photoresist layer is stripped off, followed by trench fill. Insulation dielectric materials such as high-density plasma chemical vapor deposition (HDPCVD) are deposited and then chemical mechanical polished to the pad layer 401. The pad layer 401 is then stripped off. The resultant cross section along line B—B is illustrated in FIG. 6. The elongated finger deep trench portions 24 and 26 are electrically isolated form each other by STI 601. On the top of each of the elongated finger deep trench portions 24 and 26, a trench top oxide layer 602 is provided.

Next, as shown in FIG. 7 and FIG. 8, an oxidation process is carried out, simultaneously with the memory array, to form gate insulation layer 620 on the active areas. Additional thermal process such as RTP may be carried out to diffusion dopants in Poly-2 to the substrate 10 in contact with buried strap Poly (Poly-3), thereby forming out diffusions 630. Subsequently, definition of gate conductors (GC) in the memory array and definition of finger-type conductor lines of the test key are simultaneously carried out. First, a layer of polysilicon is deposited over the substrate 10. A suitable mask and lithographic/etching processes are then performed to pattern the blanket polysilicon layer so as to form the interdigitated finger-type GC lines of the test key. As shown in FIG. 7, the interdigitated finger-type GC line layout includes a GC-T electrode layout 700 and a GC-B electrode layout 800. The GC-T electrode layout 700 comprises a plurality of GC fingers 720, 740, 760, and 780 arranged in parallel. The GC fingers 720, 740, 760, and 780 are electrically connected to a contact portion 703 by way of a bridge portion 701. Voltage signal ($V_{GC-T}$) is applied to the plurality of GC fingers 720, 740, 760, and 780 through the contact portion 703 and the bridge portion 701. Similarly, The GC-B electrode layout 800 comprises a plurality of GC fingers 820, 840, 860, and 880 arranged in parallel. The GC fingers 820, 840, 860, and 880 are electrically connected to a contact portion 803 by way of a bridge portion 801. Voltage signal ($V_{GC-B}$) is applied to the plurality of GC fingers 820, 840, 860, and 880 through the contact portion 803 and the bridge portion 801.

Still referring to FIG. 7, the GC fingers 720, 740, 760, and 780 of the GC-T electrode layout 700 and the GC fingers 820, 840, 860, and 880 of the GC-B electrode layout 800 are alternately arranged on the substrate 10, for example, the GC finger 720 is disposed between the GC fingers 820 and 840, the GC finger 840 is disposed between GC fingers 720 and 740, and so on. It is to be understood that the number of the GC fingers in FIG. 7 is only for purpose of illustration. It other cases, six or eight GC fingers may be employed. It is noted that after the formation of GC, a source/drain ion implantation process is consecutively carried out in the memory array. However, this source/drain ion implantation process is spared for the test key according to the present invention. As best seen in FIG. 8, it is worth noted that there is no source/drain region disposed in the substrate 10 at both sides of the GC finger 840 and GC finger 760.

Figure 9:
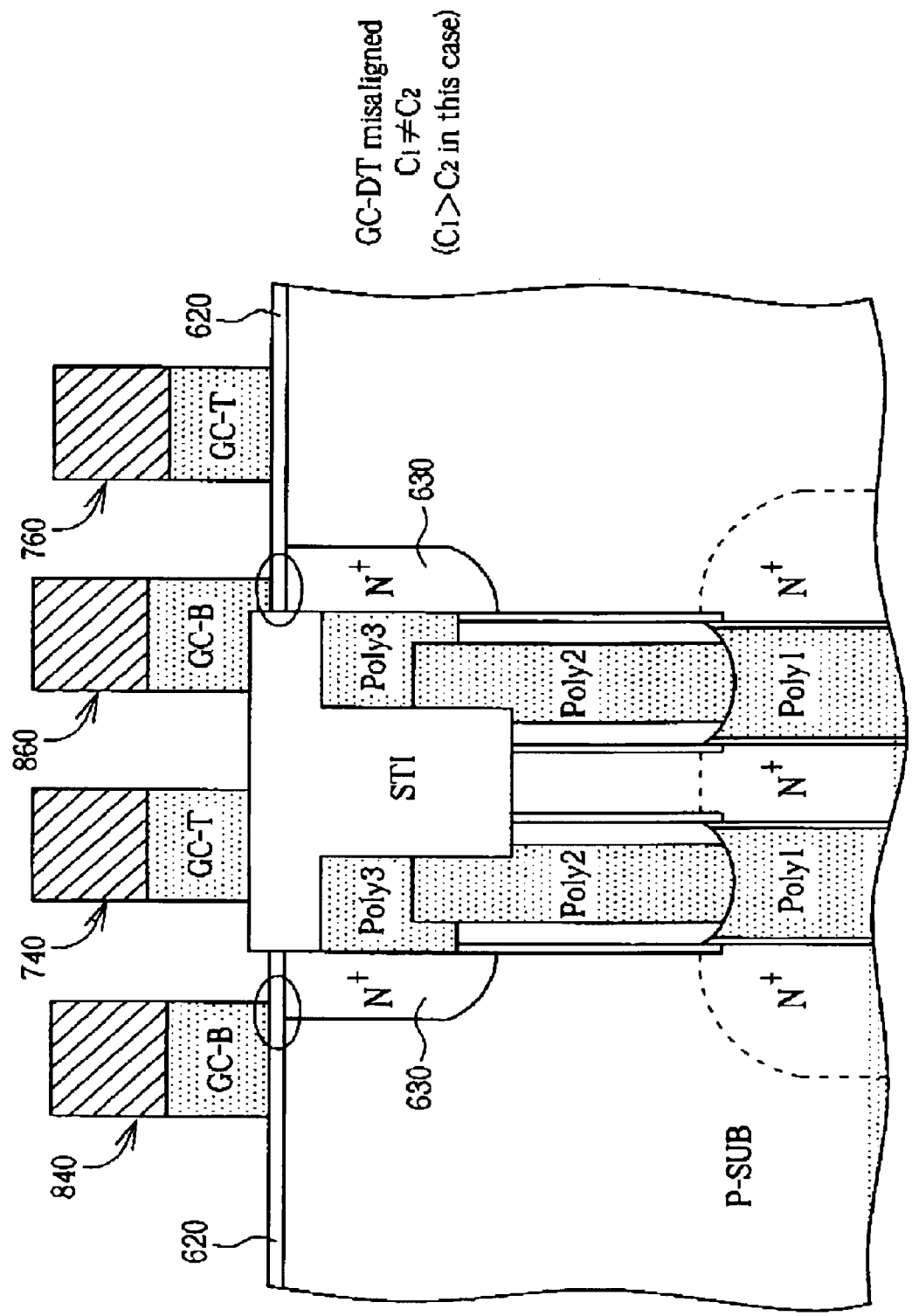

The novel wafer acceptance testing method for monitoring GC-DT misalignment during the fabrication of trench capacitor DRAM devices according to this invention is demonstrated through FIG. 8 and FIG. 9. FIG. 8 demonstrates an ideal case in which GC and DT are aligned, while FIG. 9 demonstrates a GC-DT misalignment case. As mentioned, the GC line definition of the memory array is carried out simultaneously with the GC fingers in the test key. Therefore, if there is GC-DT misalignment in the memory array, the misalignment will also occur in the test key. The prior art threshold voltage measure and evaluation method that is subject to interference is not used. Instead, a more accurate capacitance measure and evaluation method is employed. According to this capacitance measure and evaluation method of the present invention, the GC fingers 820, 840, 860, and 880 of the GC-B electrode layout 800, which are all biased to a voltage $V_{GC-B}$, function as a first electrode plate of a first capacitor C1. The second electrode of the first capacitor C1 is the N$^+$ buried strap out diffusion 630 adjacent to the elongated finger deep trench portion 24, which is biased to a reference voltage $V_{DT}$. The GC fingers 720, 740, 760, and 780 of the GC-T electrode layout 700, which are all biased to a voltage $V_{GC-T}(V_{GC-T}=V_{GC-B})$, function as a first electrode plate of a second capacitor C2. The second electrode of the second capacitor C2 is the N$^{30}$ buried strap-out diffusion 630 adjacent to the elongated finger deep trench portion 26, which is biased to a reference voltage $V_{DT}$. Since the GC finger 740 and the GC finger 860 are situated directly above the STI 601 and the trench top oxide 602, and the STI 601 and the trench top oxide 602 are so thick that the capacitance between the GC finger 740 and the out diffusion 630 and the capacitance between the GC finger 860 and the out diffusion 630 may be omitted comparing with the capacitance of C1 and C2. The equivalent testing circuit according to the present invention based on capacitance measurement is also demonstrated in an upper right corner of FIG. 7. In an ideal aligned case, the capacitance of C1 is substantially equal to the capacitance of C2.

Referring to FIG. 9, the GC-DT misalignment case is demonstrated. It is mentioned that in an ideal aligned case as set forth in FIG. 8 the capacitance between the GC finger 740 and the out diffusion 630 and the capacitance between the GC finger 860 and the out diffusion 630 may be omitted because of thick STI 601 and trench top oxide. In FIG. 9, since the GC-DT misalignment occurs, the GC finger 860, which is supposed to be laid on the STI, now shifts to the right thus partially overlapping with the out diffusion 603 adjacent to the elongated finger deep trench portion 26 (indicated by the circle region). All of the GC fingers in the test key layout have the same shift. Therefore, the GC finger 840 is now closer to the N$^+$ out diffusion 630 adjacent to the elongated finger deep trench portion 24 (indicated by the circle region), while the GC finger 760 is more space apart from the N$^+$ out diffusion 630 adjacent to the elongated finger deep trench portion 26. This results in a larger capacitance of C1 and smaller capacitance of C2 (C1>C2). From above, it is easy to assess the GC-DT misalignment by comparing the capacitances of C1 and C2. If capacitance C1, capacitance C2, GC-DT is misaligned.

Those skilled in the art will readily observe that numerous modification and alterations of the device may be made while retaining the teachings of the invention. Accordingly, the above disclosure should be construed as limited only by the metes and bounds of the appended claims.

What is claimed is:

1. A wafer acceptance testing (WAT) method for monitoring gate conductor-deep trench (GC-DT) misalignment, comprising the steps of:

providing a test key structure comprising a deep trench capacitor structure biased to a first voltage ($V_{DT}$) embedded in a substrate, an active area being defined on the substrate, wherein the deep trench capacitor structure is electrically connected to an out diffusion in the active area and is isolated by shallow trench isolation (STI), and the deep trench capacitor structure comprises an interdigitated GC-T electrode layout and a GC-B electrode layout, wherein the GC-T electrode layout is biased to a second voltage ($V_{GC-T}$), and the GC-B electrode layout is biased to a third voltage ($V_{GC-B}$), and wherein the GC-T electrode layout comprises a plurality of first GC fingers, the GC-B electrode layout comprises a plurality of second GC fingers;

measuring a capacitance of a first capacitor C1, wherein the GC-T electrode layout serves as a first electrode of the first capacitor C1 and the out diffusion serves as a second electrode of the first capacitor C1;

measuring a capacitance of a second capacitor C2, wherein the GC-B electrode layout serves as a first electrode of the second capacitor C2 and the out diffusion serves as a second electrode of the second capacitor C2; and comparing the capacitance of the first capacitor C1 with the capacitance of the second capacitor C2, wherein if $C_1 \neq C_2$, GC-DT misalignment occurs.

2. The WAT method according to claim 1 wherein the second voltage ($V_{GC-T}$) equals to the third voltage ($V_{GC-B}$).

3. The WAT method according to claim 1 wherein the deep trench capacitor structure further comprises a buried plate disposed in the substrate adjacent to a lower portion of the deep trench capacitor structure, a storage node, and a capacitor dielectric disposed between the storage node and the buried plate, wherein the storage node is electrically connected to the out diffusion.

4. The WAT method according to claim 1 wherein the GC-T electrode layout comprises a first bridge portion for electrically connecting the plurality of first GC fingers with a first contact portion.

5. The WAT method according to claim 1 wherein the GC-B electrode layout comprises a second bridge portion for electrically connecting the plurality of second GC fingers with a second contact portion.

6. A test key structure for monitoring gate conductor-deep trench (GC-DT) misalignment, comprising:

a deep trench capacitor structure biased to a first voltage ($V_{DT}$), wherein the deep trench capacitor structure is embedded in a substrate and comprises an out diffusion formed in an active area of the substrate, and wherein the deep trench capacitor structure is isolated by shallow trench isolation (STI);

an insulation layer formed on the active area;

a GC-T electrode layout biased to a second voltage ($V_{GC-T}$), the GC-T electrode layout comprising a plurality of first GC fingers; and a GC-B electrode layout biased to a third voltage ($V_{GC-B}$), the GC-B electrode layout comprising a plurality of second GC fingers, wherein the first GC fingers and the out diffusion constitute a first capacitor C1, and the second GC fingers and the out diffusion constitute a second capacitor C2, and wherein the first GC fingers and the second GC fingers are interdigitated.

7. The test key structure according to claim 6 wherein there is DO source/drain ion doped region implanted into the substrate between two adjacent GC fingers.

8. The test key structure according to claim 6 wherein the GC-T electrode layout comprises a first bridge portion for electrically connecting the plurality of first GC fingers with a first contact portion.

9. The test key structure according to claim 6 wherein the GC-B electrode layout comprises a second bridge portion for electrically connecting the plurality of second GC fingers with a second contact portion.

* * * * *